United States Patent [19]
Anderson

[11] Patent Number: 6,025,719
[45] Date of Patent: Feb. 15, 2000

[54] NUCLEAR MAGNETIC RESONANCE METHOD AND APPARATUS

[75] Inventor: Weston Anderson, Palo Alto, Calif.

[73] Assignee: Varian, Inc., Palo Alto, Calif.

[21] Appl. No.: 08/965,899

[22] Filed: Nov. 7, 1997

[51] Int. Cl.⁷ .................................................. G01V 3/00
[52] U.S. Cl. ........................................ 324/318; 324/315
[58] Field of Search .................................. 324/318, 322, 324/315, 314, 312, 307, 309

[56] References Cited

U.S. PATENT DOCUMENTS

| | | | |
|---|---|---|---|
| 3,577,067 | 5/1971 | Weaver | 324/318 |
| 5,166,615 | 11/1992 | Sidles | 324/307 |
| 5,572,127 | 11/1996 | Wong et al. | 324/315 |
| 5,684,401 | 11/1997 | Peck et al. | 324/318 |

*Primary Examiner*—Louis Arana

[57] ABSTRACT

Net magnetic flux trapped in an NMR high temperature superconducting RF probe coil magnetically coupled with a main excitation DC magnetic field of an NMR device of which the probe is a part is reduced by moving the probe coil relative to the main magnetic field axis. There is a resulting interaction between the moving probe coil and the main excitation DC magnetic field to induce a current in the probe coil. The induced current reduces the net magnetic flux trapped in the probe coil. The probe coil is moved so the induced current is an AC current having an envelope with decreasing amplitude as a function of time. An electromechanical drive, produced by a magnetic field or an electrostatic field or a piezoelectric transducer attached to a substrate carrying the probe coil, provides oscillatory movement of the probe coil.

23 Claims, 3 Drawing Sheets

FIG. I
PRIOR ART

NUCLEAR MAGNETIC RESONANCE METHOD AND APPARATUS

FIELD OF THE INVENTION

The present invention relates generally to nuclear magnetic resonance (NMR) methods and apparatus and more particularly to a method of and apparatus for reducing net magnetic flux trapped in an NMR superconducting RF probe coil by mechanically moving the coil relative to a main DC excitation field of the NMR apparatus so there is an interaction between the moving coil and the field to induce a trapped magnetic flux-reducing current in the coil.

BACKGROUND OF THE INVENTION

In one known type of nuclear magnetic resonance apparatus, a low temperature superconducting coil supplies a relatively high intensity main DC magnetic field to a sample in a predetermined axial direction; the axial direction is usually vertical and referred to as the Z axis. A pulsed RF field having an appropriate frequency, determined by the DC magnetic field and the nature of the sample, is applied to the sample by a high temperature superconducting probe coil to produce an oscillatory magnetic field along a direction orthogonal to the Z axis. As a result of an interaction between the atoms in the sample, the main DC magnetic field and the RF field, nuclei in the sample precess about the Z axis. After the pulsed RF field is no longer being applied to the sample, the nuclei continue to precess as they return to their original state, inducing a current in the probe coil. The frequencies (or "frequency components") of the current induced in the probe coil is indicative of and determined by the properties of molecules in the sample.

As reported in my co-pending, commonly assigned application Ser. No. 08/965,730, (Varian Docket No. 95-33), entitled "Magnetic Susceptibility Control of Superconducting Materials in Nuclear Magnetic Resonance Probes" filed concurrently herewith, I have discovered that the high temperature superconducting (HTS) probe coil has a tendency to trap a portion of the main DC magnetic field that extends in the Z-axis direction. In the co-pending application Ser. No. 08/965,842, (Varian Docket No. 95-65), entitled "AC Magnetic Susceptibility Control of Superconducting Materials in Nuclear Magnetic Resonance (NMR) Probes" filed concurrently herewith, of which I am a joint inventor, the trapped magnetic field is reduced by applying an AC magnetic field perpendicular to the surface of the HTS probe coil and having a ramped envelope and a relatively low frequency, e.g., 60 Hz. Initially, the applied field is ramped upwardly and then is ramped downwardly. The ramped field applied to the high temperature superconducting probe coil is produced by connecting a 60 Hz source to a further metal coil in close proximity to the probe coil. The field trapping occurs because it is impossible to arrange the high temperature superconducting probe coil so it extends perfectly parallel to the Z axis and because the main DC magnetic field is not homogeneous.

A possible problem with this prior art approach is significant crowding of physical elements in the region where the probe coil is located, bearing in mind that, during NMR normal operation, there is RF coupling between the probe coil and an additional RF metal coil selectively coupled to an RF source and an RF detector. The additional coil and the probe coil must be in close proximity to each other to provide adequate magnetic coupling between them. Crowding is more of a problem when it is realized that, in virtually all configurations, there are two probe coils, on opposite sides of the sample. In addition, a tuning element, such as a paddle, must be provided, which also requires space near the probe coil.

It is, accordingly, an object of the present invention to provide a new and improved apparatus for and method of reducing net DC magnetic flux trapped in a probe coil of a nuclear magnetic resonance device.

Another object of the invention is to provide a new and improved method of and apparatus for reducing net DC magnetic flux trapped in a high temperature superconducting NMR probe coil, wherein the field is reduced with an apparatus that is not necessarily aligned with the coil, but which has an effect on a substrate carrying the coil, and wherein the volume requirements of the structure which enables the field to be reduced are relatively low.

SUMMARY OF THE INVENTION

In accordance with one aspect of the invention, net magnetic flux trapped in an NMR high temperature superconducting RF probe coil magnetically coupled with a main excitation magnetic field of an NMR device of which the probe is a part is reduced by moving the probe coil relative to a longitudinal axis of the main magnetic field. There is a resulting interaction between the moving probe coil and the main excitation magnetic field to induce a current in the probe coil. The induced current reduces the net magnetic flux trapped in the probe coil. The coil has a component of movement in a direction at right angles to the main magnetic field longitudinal axis to cause the current to be induced in the coil. Preferably, the probe coil is moved so the induced current is an AC current having an envelope with a decreasing amplitude.

The coil is preferably moved by applying an AC excitation wave having an envelope with decreasing amplitude as a function of time to an electromechanical drive, which can be of the magnetic, electrostatic or piezoelectric type.

In a preferred embodiment, the electromechanical drive applies a force to a first deflectable edge of a substrate on which the coil is mounted. The substrate is fixedly mounted on a second edge opposite from the first edge. The electromechanical drive deflects the first edge of the coil relative to the second edge so the first edge and coil move toward and away from the main magnetic field axis. Preferably, the probe coil is on a broad substrate face that extends in the Z axis direction and the substrate has a predetermined mechanical resonant frequency in a bending mode along an X axis at a right angle to both the broad face and to the Z axis. The drive supplies an oscillating bending force at the resonant frequency in the X axis direction to the substrate to enhance mechanical movement of the substrate and coil. Alternatively the drive supplies an impulse force deflecting the first edge of the substrate relative to the second edge so that the first edge and the coil move toward or away from the main magnetic field axis. At the termination of the impulse, the substrate containing the coil oscillates in a bending mode along an X axis at right angles to both the broad face and the Z axis. The frictional losses cause the oscillation to exhibit an envelope with decreasing amplitude as a function of time.

The above and still further objects, features and advantages of the present invention will become apparent upon consideration of the following detailed descriptions of several specific embodiments thereof, especially when taken in conjunction with the accompanying drawings.

DESCRIPTION OF THE PREFERRED EMBODIMENTS

Figure 1:
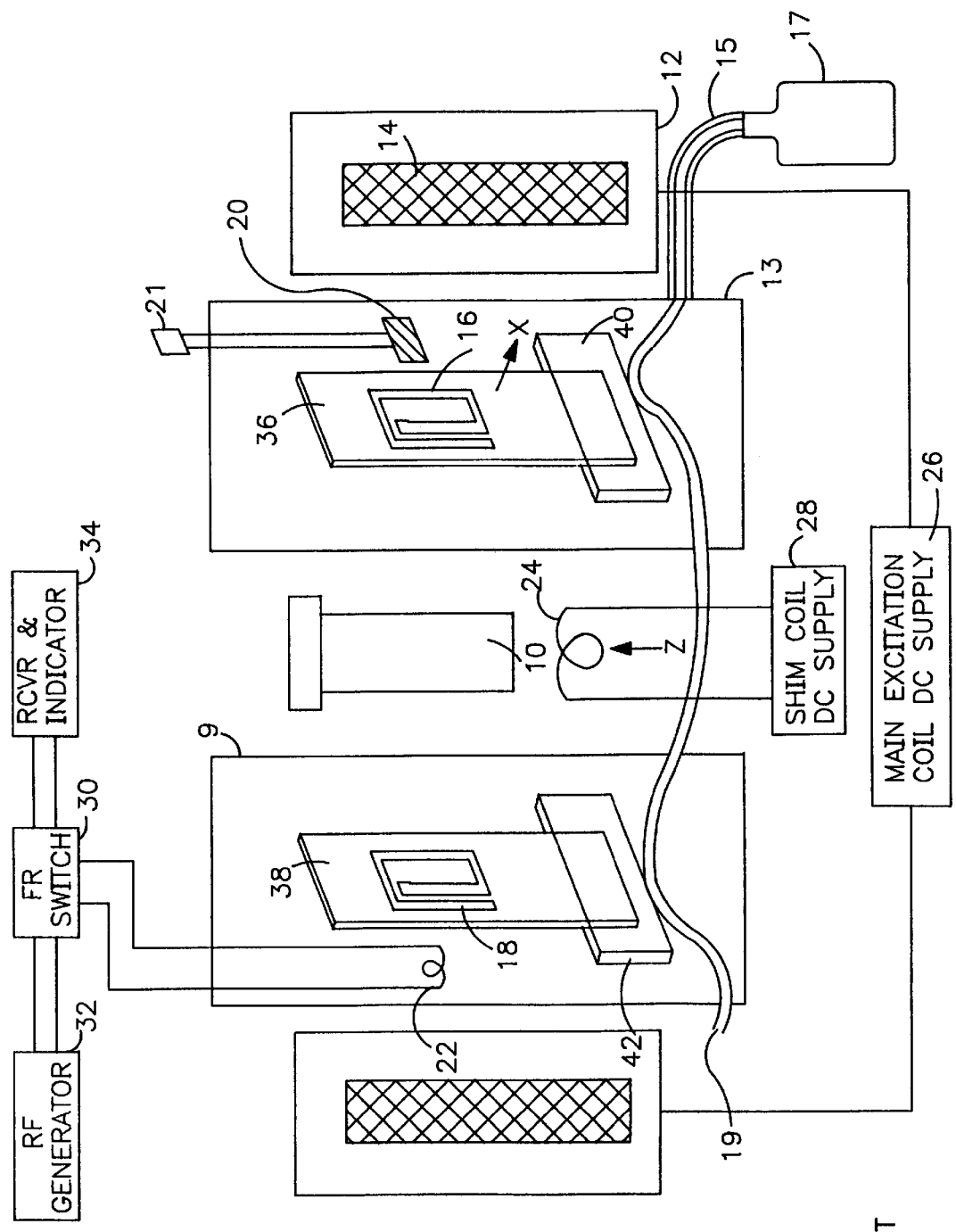
FIG. 1 is a schematic diagram of a nuclear magnetic resonance apparatus of the type with which the present invention is used.

Reference is now made to FIG. 1 of the drawing, wherein a known NMR apparatus for analyzing a sample in a non-magnetic sample holder 10 is illustrated as including non-magnetic metal dewar 12 having a suitable thermal insulating arrangement for enabling main low temperature superconducting solenoid DC excitation coil set 14 to be at the temperature of liquid helium.

Solenoid coil 14 produces a strong DC magnetic field nominally in the Z direction. Thin film HTS RF probe coils 16 and 18 (preferably made of yttrium-barium-copper oxide, e.g., $Yba_2 Cu_3 O_{7-8}$) produce RF fields nominally in the X direction. Small misalignment between the solenoid coil 14 and the thin film surfaces of the probe coils 16 and 18 permit some DC magnetic field components to penetrate the surfaces of the thin film materials of the probe coils. This partial penetration causes currents to be set up in the thin film material which produce magnetic fields tending to oppose the penetrating field components. The resulting fields (which oppose the penetrating field components) are not uniform and produce undesired magnetic field gradients in the sample region thereby broadening the NMR signal.

To induce currents in and couple currents from probe coils 16 and 18, probe coil 18 is closely coupled with metallic RF excitation coil 22. Coil 16 is excited by its coupling to coil 18. The coils are tightly coupled (overcoupled) and are tuned by a metal paddle 20. The tuning may be changed by moving paddle 20 by handle 21. The NMR apparatus further includes shim coil arrangement 24 for producing DC magnetic fields that reduce perturbations in the main magnetic field established by coil 14. Coils 18 and 22 are positioned on one side of sample holder 10, while coil 16 and paddle 20 are positioned on the opposite side of the sample holder, whereby magnetic fields are coupled between coils 18 and 22 and between coils 16 and 18. DC currents are respectively supplied by DC sources 26 and 28 to coils 14 and 24 to produce the main DC magnetic field in sample holder 10 in the direction of the vertical, Z, axis. The main DC magnetic field is quite strong, typically being on the order of 10 Tesla RF generator 32 selectively supplies pulsed RF current to coil 22 via transmit-receive (T-R) switch 30. The RF current supplied to coil 22 is magnetically coupled to high temperature superconducting coils 16 and 18, thence to the sample in holder 10. The sample responds to the RF magnetic fields produced by the superconducting coils so nuclei thereof precess. After the RF pulse has ended, the resulting nuclear free induction decay signal is magnetically coupled back to coils 16 and 18, thence to coil 22. The RF magnetic flux coupled back to coil 22 from probe coils 16 and 18 is coupled through T-R switch 30 to receiver and readout device 34.

Coils 16 and 18 generally extend vertically and are mounted in planes generally parallel to each other on broad, planar faces of dielectric substrates 36 and 38, respectively. Substrates 36 and 38 are preferably made of sapphire, a dielectric material having high thermal conductivity and the capability to bend somewhat toward and away from the Z axis. Substrates 36 and 38 are fixedly mounted in thermal blocks 40 and 42, in turn fixedly mounted to vacuum enclosure 13. Thermal blocks 40 and 42 function as heat sinks to maintain the desired low temperature, typically between 20K and 77K of coils 16 and 18 via substrates 36 and 38.

Thermal blocks 40 and 42 are cooled by cold helium gas supplied by the liquid helium dewar 17. The gas flows through closed insulated tube 15 from dewar 17 to thermal blocks which are thermally anchored to an uninsulated portion of tube 15. The spent helium is exhausted to the room air at exit port 19. Thermal blocks 40 and 42, substrates 36 and 38 with coils 16 18 and 22 and paddle 20 are all mounted in vacuum enclosure 13 which provides the necessary thermal isolation. Vacuum enclosure 13 has an inner wall 9 that surrounds sample holder 10. Inner wall 9 is made of a non-conductive dielectric material such as quartz or alumina to enable the RF magnetic field from coils 16 and 18 to penetrate and couple to the NMR sample. The foregoing description of FIG. 1 concerns a known, state-of-the-art nuclear magnetic resonance apparatus.

Figure 2:
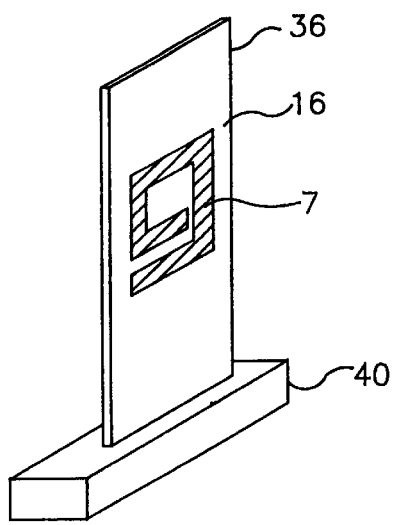
FIG. 2 is a perspective, somewhat schematic diagram of a substrate in combination with a high temperature superconducting coil.

Reference is now made to FIG. 2 wherein substrate 36 is illustrated as carrying high temperature superconducting coil 16. The coil 16 is composed of superconducting material 7 which forms a thin layer fixed to substrate 36. Typically the thickness of the superconducting material is 0.3 to 0.6 micrometers, and the width of the material typically is 0.1 to 1 millimeters, and arranged in a configuration to form the coil with sufficient self capacity to resonate near the desired frequency. The lower edge of substrate 36 is fixedly mounted on thermal block 40. The strong static magnetic field is nominally applied parallel to the face of substrate 36 and superconducting material 7. If the alignment were perfect, the superconducting material would produce negligible magnetic field gradients at the sample location. In practice it is difficult to achieve the desired degree of alignment, permitting some of the magnetic field lines to have components perpendicular to the face of the superconducting material setting up circulating currents which flow parallel to the face of the superconducting material and cause undesired magnetic field gradients at the sample location. Persistent circulating currents may also be set up during rapid cooling of the sample in the magnetic field. The circulating currents and their resulting trapped magnetic fields persist because of the superconducting properties of the material. The trapped fields reduce the magnetic field homogeneity at the sample and have a detrimental effect on the output of the NMR apparatus.

Figures 3A, 3B, 3C:
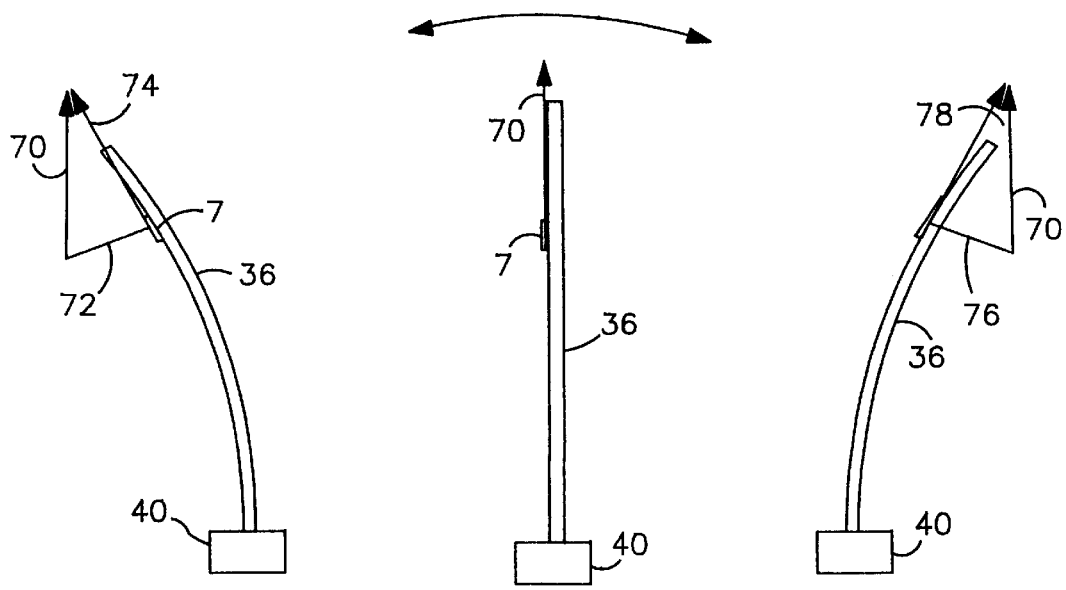
FIGS. 3a, 3b and 3c show an oscillating substrate at three points of its oscillation relative to an axis of a main DC magnetic excitation field of the apparatus illustrated in FIG. 1.

I have found that the trapped field in the high temperature superconducting materials of coils 16 and 18 of FIG. 1 can be reduced by causing the substrates 36 and 38 to mechanically vibrate while in the strong applied magnetic field. This is illustrated with the aid of FIGS. 3a, 3b, and 3c. The strong magnetic field $B_z$ is represented by 70 and is nominally parallel to the face of substrate 36 and superconducting material 7. By causing the substrate to vibrate in a damped sinusoidal motion, an oscillating magnetic field component is produced that is normal to the face of the superconducting material. FIGS. 3b and 3c illustrate in exaggerated form the magnetic field components at the left and right excursions of the vibration. For the left excursion illustrated in FIG. 3b, the strong magnetic field component 70 has a component 72 normal to superconducting material 7 and component 74 parallel to superconducting material 7. At a right excursion illustrated in FIG. 3c, the strong magnetic field 70 has component 76 normal to superconducting material 7 and component 78 parallel to superconducting material 7. It is to be noted that normal field components 72 and 76 are opposite directed, so that as the substrate vibrates an oscillating magnetic field is produced that is normal to the superconducting material 7. The trapped magnetic field in the superconductor material 7 can be reduced by applying a damped oscillating magnetic field normal to the superconducting material so the amplitude of the oscillation gradually decreases to zero as a function of time.

In the preferred embodiment, the damped oscillating magnetic field is applied from time to time to probe coils 16 and 18 of FIG. 1 by mechanically imparting oscillatory motion to the broad faces of substrates 36 and 38 and bending the coils deposited on these faces so the coils move toward and away from the Z axis while the device is not being used to analyze a sample. By mechanically moving substrates 36 and 38, the necessity to provide a further relatively large coil for inducing damped currents in coils 16 and 18 is obviated. Such additional coils, which must be proximate to substrates 36 and 38, would require additional space.

The result is provided by electromechanical devices applying oscillating forces having damped envelopes to substrates 36 and 38. In a pair of embodiments the force is a magnetic or electrostatic damped oscillatory force applied to a top edge of each of substrate 36 and 38, i.e., the edges of the substrates remote from the bottom substrate edges that are fixedly mounted on thermal blocks 40 and 42. Alternatively, the substrates are bent in a damped oscillatory manner by a piezoelectric transducer, positioned close to the fixed, bottom edges of the substrates. As substrates 36 and 38 bend in an oscillatory manner in an X axis direction (at right angles to the broad faces of the substrates and to the Z axis), toward and away from the Z axis, probe coils 16 and 18 have damped AC currents induced in them by the main DC magnetic excitation field. The AC currents are induced in probe coils 16 and 18 due to relative motion between the moving probe coils and the main DC excitation field. The damped AC currents produce damped magnetic fields in probe coils 16 and 18, to reduce substantially to zero the net magnetic flux trapped in these coils. The damped motion of substrates 36 and 38 and coils 16 and 18 is provided by initially imparting a relatively large deflection to the substrates from the Z axis and then gradually reducing the deflection of the substrates to and from about the Z axis.

Since the faces carrying the superconducting coils oscillate through an angle of $\pm\Theta$, an AC field is produced in the superconducting coil that is proportional to $B_z \sin \Theta$, where $B_z$ equals the main DC magnetic field in the Z axis direction established by solenoid 14, $\Theta$ is the angle between the Z axis field and the broad planar faces of coils 16 and 18. A 120 Gauss RMS field (sufficient to reduce the trapped flux in coils 16 and 18 to an adequate level) can be obtained by positioning coils 16 and 18 in a Z axis magnetic field of 9.4 Tesla and by oscillating coils 16 and 18 through a maximum angle of $\pm 0.1°$. Since probe coils 16 and 18 are rotated in the X axis direction to and from about the Z axis for approximately one minute, while no excitation current is applied to the probe coils by RF source 32, one need not be concerned about the vibration or other disturbances that might be associated with movement of the probe coils.

Figure 4:
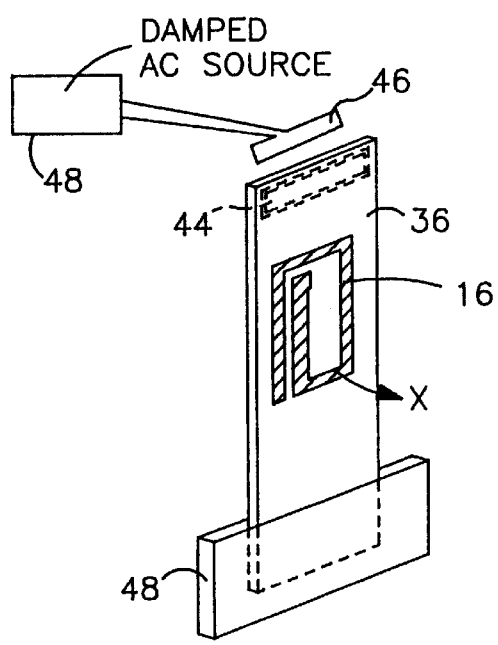
FIG. 4 is a coil and substrate similar to FIG. 2 in combination with an arrangement for oscillating the substrate relative to an axis of a main DC magnetic field excitation of the apparatus of FIG. 1.

Reference is now made to FIG. 4 of the drawing wherein substrate 36 is illustrated as carrying high temperature superconducting coil 16. The lower edge of substrate 36 is fixedly mounted on thermal block 40, in turn fixedly mounted to vacuum enclosure 13. One-turn closed loop high temperature superconducting coil 44 is deposited on the planar broad face of substrate 36, close to the top, free deflectable edge of the substrate, remote from thermal block 40. Coil 46 is mounted in close proximity to coil 44 and is spaced from substrate 36. The spacing between coils 46 and 44 is such that magnetic flux from coil 46 is coupled to coil 44 when coil 46 is energized by AC, 60 Hz source 48. The peak amplitude of current supplied by source 48 to coil 46 is initially relatively large and gradually decreases to a zero value over many cycles, to provide a damped envelope having a duration of approximately one minute. In response to the current from source 48, coil 46 induces a damped current in coil 44, to cause substrate 36 to bend in thermal block 40 in the X axis direction toward and away from the Z axis. (Since the force between coils 44 and 46 is repulsive and is independent of the sign of the current from source 48, the frequency of source 48 is set to be approximately on half the mechanical resonant frequency of substrate 36.) As described before, the interaction of coil 16 with the main DC excitation field derived from coils 14 and 24 decreases the DC magnetic field trapped by coil 16. I have found that a very slight 0.1° peak oscillation of coil 16 provides the desired effect to remove most of the net magnetic flux trapped in coil 16. (Since the force between coils 44 and 46 is repulsive and is independent of sign of the current from source 48, the frequency of source 48 is set to approximately one half the mechanical resonant frequency of substrate 36.)

Figure 5:
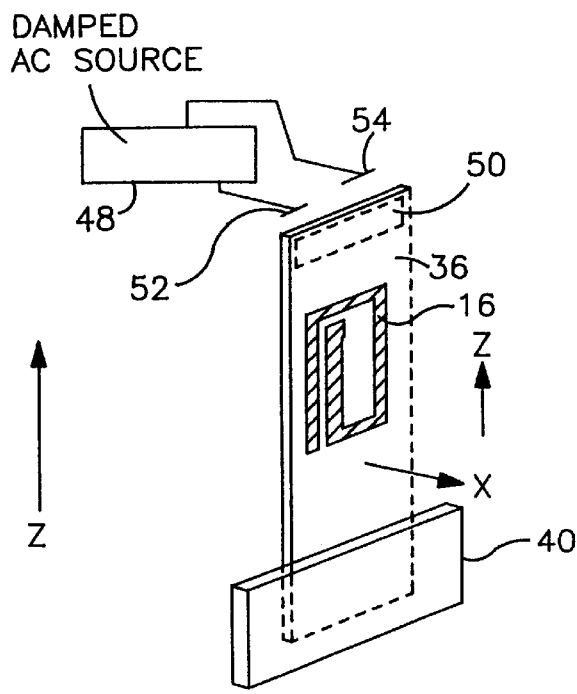
FIG. 5 is a modification of the arrangement illustrated in FIG. 2 wherein the oscillation is provided by an electrostatic field.

Reference is now made to FIG. 5 of the drawing, a diagram of a further embodiment of the invention, wherein metallic electrode 50 is deposited on the broad planar face of substrate 36, close to the top edge of the substrate. Electrode 50 extends parallel to the top edge and between the side edges of the substrate. Opposite sides of electrode 50 are in close proximity to and are electrostatically coupled with electrodes 52 and 54. Electrodes 52 and 54 are spaced from substrate 36 and connected to opposite terminals of AC 60 Hz source 48, having a damped envelope. Electrodes 50, 52 and 54 interact with each other to cause substrate 36 to bend in the -X axis direction and to oscillate along the X-axis. Since the force between electrodes 52 and 54 and substrate electrode 50 is attractive independent of the sign of voltage applied by source 48, the frequency of source 48 is set to be approximately one half the mechanical resonant frequency of substrate 36.

Figure 6:
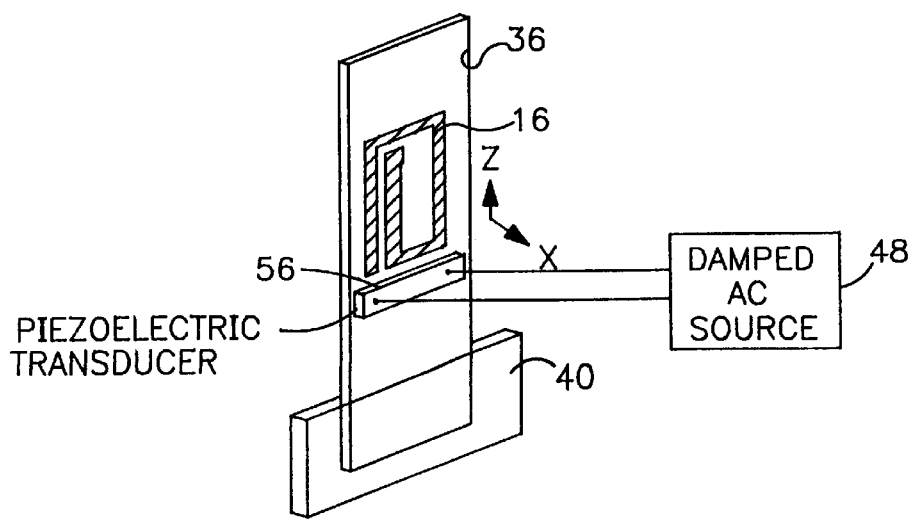
FIG. 6 is a modification of the apparatus illustrated in FIG. 2 wherein the oscillation is provided by a piezoelectric transducer mounted on the substrate.

In a third embodiment, illustrated in FIG. 6, piezoelectric transducer 56 is fixedly mounted on the broad planar face of substrate 36, so the transducer extends generally parallel to thermal block 40 between the opposite, vertically extending edges of the substrate. Transducer 56 has terminals directly connected to opposite terminals of AC source 48 and oscillates substrate 36 and coil 16 with substantially the same motion as is attained with the embodiments of FIGS. 4 and 5. Generally, the deflection frequency of a piezoelectric transducer is equal to the drive frequency so the frequency of the electrical source 48 is set to be near the mechanical resonant frequency of substrate 36.

A minimum of electrical drive power from source 48 is obtained by setting the frequency of ac source 48 to a value that causes substrate 36 to oscillate at its lowest resonant mode. Substrate 36 can also be forced to oscillate at frequencies above or below its lowest resonant mode by the selection of the frequency and amplitude of source 48.

The arrangements of FIGS. 4 and 5 have an advantage over the arrangement of FIG. 6 because none of the components on substrates 36 in the arrangements of FIGS. 2 and 3 have connections to any devices external to the substrate. In contrast, in FIG. 6, piezoelectric transducer 56 has connections from substrate 36 directly to source 48.

Another arrangement (not shown) which could be used to move substrate 36 toward and away from the Z axis, in the direction of the X axis, is to mount an eccentric weight on the end of a rotating shaft fixedly mounted on the substrate. The effectiveness of all of these drive mechanisms is increased by adjusting the frequency of the mechanical resonant bending mode that the substrate undergoes in vibrating in the X axis direction so the resonant frequency equals frequency of the driving source.

The drive sources of FIGS. 4–6 have used a damped AC source to excite the mechanical motion. An alternative embodiment employs a pulsed source with the natural mechanical resonant frequency of substrate 36 to produce the damped vibrating motion. In this case, electrical source 48 provides a single electrical pulse of short duration and then shuts off while substrate 36 undergoes a dumped vibrating motion.

While there have been described and illustrated specific embodiments of the invention, it will be clear that variations in the details of the embodiments specifically illustrated and described may be made without departing from the true spirit and scope of the invention as defined in the appended claims.

What is claim is:

1. A method of reducing net magnetic flux trapped in an NMR superconducting RF probe coil magnetically coupled with a main excitation magnetic field of an NMR device of which the probe coil is a part, the probe coil extending in a plane generally parallel to a Z axis in which the main excitation magnetic field extends, comprising moving the probe coil relative to the Z axis so there is an interaction between the moving probe coil and the main excitation magnetic field to induce a current in the probe coil, the induced current being such as to reduce the net magnetic flux trapped in the probe coil.

2. The method of claim 1 wherein the probe coil is moved so the induced current is an AC current having an envelope with a decreasing amplitude as a function of time.

3. The method of claim 2 wherein the coil is moved by applying an AC excitation wave having an envelope with decreasing amplitude as a function of time to an electromechanical drive, the electromechanical drive moving the coil in response to the AC excitation wave.

4. The method of claim 2 wherein the coil has a component of movement in a direction at right angles to the Z axis to cause the current to be induced in the coil.

5. The method of claim 3 wherein the electromechanical drive applies a force to a first deflectable edge of a substrate on which the coil is mounted, the substrate being fixedly mounted on a second edge opposite from the first edge, the electromechanical drive deflecting the first edge and the coil relative to the second edge so the first edge and coil move toward and away from the Z axis.

6. The method of claim 1 wherein the coil has a component of movement in a direction at right angles to the Z axis to cause the current to be induced in the coil.

7. The method of claim 1 wherein the coil is moved by applying an AC excitation wave to an electromechanical drive, the electromechanical drive moving the coil in response to the AC excitation wave.

8. The method of claim 7 wherein the electromechanical drive applies a force to a first deflectable edge of a substrate on which the coil is mounted, the substrate being fixedly mounted on a second edge opposite from the first edge, the electromechanical drive deflecting the first edge and the coil relative to the second edge so the first edge and coil move toward and away from the Z axis.

9. The method of claim 1 further comprising operating the NMR device to analyze a sample only while the probe coil is stationary.

10. An NMR device for analyzing a sample comprising a main magnetic field source for applying a main magnetic field to the sample along a Z axis, an RF superconducting probe coil extending generally parallel to the Z axis and coupled to the sample, the RF superconducting probe coil being coupled to the main magnetic field so net magnetic flux from the main magnetic field is trapped in the probe coil, a drive for moving the probe coil relative to the Z axis so there is an interaction between the moving probe coil and the main magnetic field to induce an AC current in the probe coil, the AC current causing a reduction in the net magnetic flux trapped in the RF probe coil.

11. The device of claim 10 wherein the probe coil is a high temperature superconductor.

12. The device of claim 10 wherein the probe coil is a high temperature superconductor on a dielectric substrate having a fixed edge, the substrate and probe coil being arranged so the drive can deflect them back and forth relative to the fixed edge in a direction at right angles to the axis to provide interaction between the moving probe coil and the main magnetic field.

13. The device of claim 12 wherein the fixed edge is mounted in a thermal heat sink block for assisting in maintaining the RF probe coil at a superconducting temperature.

14. The device of claim 10 wherein the drive is an electromechanical drive.

15. The device of claim 14 wherein the probe coil is a high temperature superconductor on a dielectric substrate having a fixed edge, the substrate and probe coil being arranged so the drive can deflect them back and forth relative to the fixed edge in a direction at right angles to the axis to provide interaction between the moving probe coil and the main magnetic field.

16. The device of claim 15 wherein the electromechanical drive is arranged to couple an oscillating force field to a second deflectable edge of the substrate opposite from the first edge.

17. The device of claim 16 wherein the electromechanical drive includes a further coil on the substrate proximate the second edge, the further coil being displaced from the RF probe coil and responsive to an oscillating magnetic field derived by a source displaced from the substrate and proximate the further coil.

18. The device of claim 16 wherein the electromechanical drive includes an electrode arrangement on the substrate proximate the second edge, the electrode arrangement being displaced from the RF probe coil and responsive to an oscillating electrostatic field derived by a source displaced from the substrate and proximate the electrode arrangement.

19. The device of claim 15 wherein the electromechanical drive includes a piezoelectric transducer on the substrate, the piezoelectric transducer being displaced from the RF probe coil and responsive to an oscillating voltage derived by a source connected to the transducer.

20. The device of claim 15 wherein the probe coil is on a broad substrate face that extends in the Z axis direction and the substrate has a predetermined mechanical resonant frequency in a bending mode along an X axis at a right angle to both the broad face and to the Z axis, the electromechanical drive supplying an oscillating bending force at the resonant frequency in the X axis direction to the substrate.

21. The device of claim 14 wherein the electromechanical drive is arranged to cause the induced AC current to have an envelope that decreases in amplitude as a function of time.

22. The device of claim 21 wherein the electromechanical drive is arranged to impart an oscillating electromotive force to the substrate, the imparted oscillating electromotive force having an envelope that decreases in amplitude as a function of time.

23. The device of claim 15 wherein the probe coil is disposed on a broad substrate surface that extends in the Z axis direction and the substrate has a predetermined mechanical resonant frequency in a bending mode along an X axis at a right angle to both the broad surface and to the Z axis, the electromechanical drive supplying an impulse bending force whereby, said substrate oscillates in response to said force at its mechanical resonant frequency with a slowly decreasing amplitude as a function of time.

* * * * *